United States Patent [19]

Oguri et al.

[11] Patent Number: 4,634,492
[45] Date of Patent: Jan. 6, 1987

[54] CHRYSOBERYL SINGLE CRYSTAL AND METHOD OF PRODUCING THE SAME

[75] Inventors: Hitoshi Oguri, Funabashi; Motoya Hirota, Narashino, both of Japan

[73] Assignee: Sumitomo Cement Co., Ltd., Tokyo, Japan

[21] Appl. No.: 608,692
[22] PCT Filed: Jul. 14, 1983
[86] PCT No.: PCT/JP83/00227
§ 371 Date: Apr. 26, 1984
§ 102(e) Date: Apr. 26, 1984
[87] PCT Pub. No.: WO85/00392
PCT Pub. Date: Jan. 31, 1985
[51] Int. Cl.⁴ ............... C30B 13/22; C30B 29/20; C30B 29/22
[52] U.S. Cl. ............ 156/605; 156/DIG. 61; 501/86
[58] Field of Search ........... 501/86; 156/605, 607, 156/DIG. 61

[56] References Cited
U.S. PATENT DOCUMENTS
4,218,282 8/1980 Kochi .................. 156/DIG. 61

FOREIGN PATENT DOCUMENTS
55-62884 5/1980 Japan .
55-62890 5/1980 Japan ................. 156/DIG. 61
57-191298 2/1983 Japan .
58-55396 6/1983 Japan .
1377428 12/1974 United Kingdom ....... 156/DIG. 61

Primary Examiner—Mark L. Bell
Attorney, Agent, or Firm—Armstrong, Nikaido, Marmelstein & Kubovcik

[57] ABSTRACT

In order to produce a chrysoberyl single crystal displaying a luminous band effect, a mixture of a principal component consisting of beryllium oxide and aluminum oxide in nearly equal molar amounts with small amounts of titanium oxide and coloring metal oxide is sintered or melted and solidified in a non-oxidizing gas atmosphere to provide a raw material bar; the raw material bar is heated in a non-oxidizing gas atmosphere by means of a light condense-heating type floating zone method to grow a chrysoberyl single crystal; and the single crystal is heated so as to allow needle crystals of titanium oxide to be deposited in one orientation in the chrysoberyl single crystal.

6 Claims, 1 Drawing Figure

CHRYSOBERYL SINGLE CRYSTAL AND METHOD OF PRODUCING THE SAME

TECHNICAL FIELD

The present invention relates to a chrysoberyl single crystal displaying a luminous band effect and a method of producing the same.

BACKGROUND ART

Growth of a chrysoberyl single crystal displaying a luminous band effect has been attempted hitherto by making a raw material bar using beryllium oxide, aluminum oxide and titanium (III) oxide, by growing a single crystal with a condense-heating floating zone method, and by carrying out further heat-treatment.

However, because the production of the raw material and the growth of a crystal are carried out in a normal atmosphere, titanium becomes quadrivalent, making it difficult to solid-dissolve it into the chrysoberyl single crystal, and making it difficult to obtain a single crystal even if it does solid-dissolve to some extent. Accordingly, the production of a chrysoberyl single crystal in which titanium is solid-dissolved has been difficult, and the resultant single crystal does not display a luminous band effect even after heat-treatment.

DISCLOSURE OF THE INVENTION

An object of the present invention is to provide a chrysoberyl single crystal of high quality excellent in displaying a luminous band effect.

Another object of the present invention is to provide an efficient method of producing a chrysoberyl single crystal of high quality excellent in displaying a luminous band effect.

A chrysoberyl single crystal displaying a luminous band effect according to the present invention is provided by heat-treating a chrysoberyl single crystal containing solid-dissolved trivalent titanium.

The method according to the present invention to produce the above-mentioned chrysoberyl single crystal displaying a luminous band effect is characterized in that a chrysoberyl single crystal is grown by heating, by means of a condense-heating floating zone method in a non-oxidizing gas atmosphere, a raw material bar which has been made by sintering or melting and solidifying beryllium oxide and aluminum oxide of nearly equal molar amounts as principal components and a small amount of titanium (III) oxide and coloring metal oxide, by means of a condense-heating floating zone method in a non-oxidizing gas atmosphere, and then needle crystals of titanium (III) oxide are deposited in one orientation in the chrysoberyl single crystal by heat-treating said single crystal.

BEST MODE FOR CARRYING OUT THE INVENTION

Figure 1:
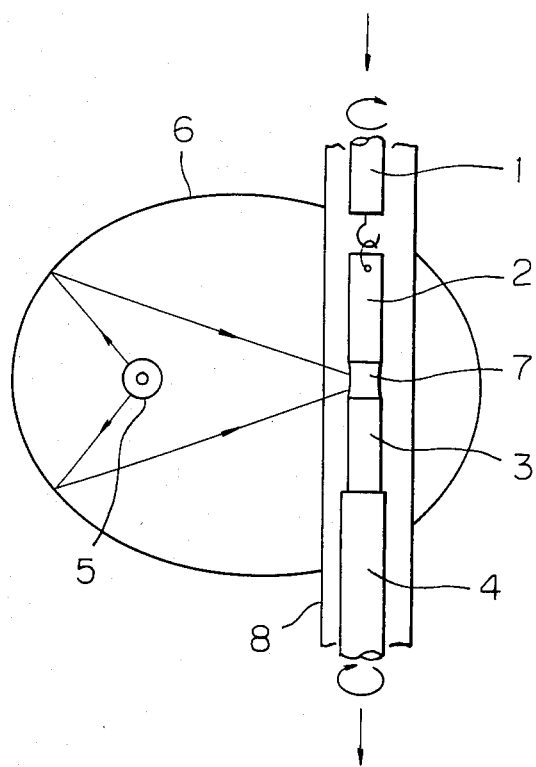
FIG. 1 is an explanatory drawing of a floating apparatus of a condense-heating type used to practice the method of the present invention.

The term "luminous band effect" in the present invention means the effect given by needle crystals precipitated systematically in a single crystal, such as a cat's-eye and a star ruby, thereby presenting a cat's-eye or star-like appearance when exposed to a light.

In a chrysoberyl single crystal of the present invention, the principal component thereof has a composition of the formula $BeAl_2O_4$, and iron, chromium, vanadium, and the like are solid-dissolved into said principal component in a molar amount of from 0.1 to 0.4 percent.

In order to produce a chrysoberyl single crystal displaying a luminous band effect, it is necessary to grow a single crystal in which titanium (III) is solid-dissolved, then to deposit needle crystals of titanium oxide in a definite direction in the single crystal by heat-treatment, and make a cabochon cut in that direction. The important factors in this method are the growth of a chrysoberyl single crystal in which titanium is solid-dissolved and the heat-treatment of the single crystal.

When titanium is solid-dissolved in chrysoberyl ($BeAl_2O_4$), titanium is substituted for trivalent aluminum ion and solid-dissolved. In this case, the substituted titanium ion must be trivalent, in order to maintain an electrical neutrality.

In the present invention, the above-mentioned problem has been solved by regulating the valency of titanium to trivalent using a non-oxidizing atmosphere in the stages of making a raw material bar and growing a single crystal, whereby a chrysoberyl single crystal containing solid-dissolved trivalent titanium and having a high quality is produced.

In the method of the present invention, a raw material bar is made first. That is to say, a raw material bar is obtained by mixing small amounts of titanium (III) oxide and coloring metal oxide with a principal component composed of a mixture of beryllium oxide and aluminum oxide in equivalent molar amounts and by heating the raw material mixture in a non-oxidizing gas atmosphere, to sinter or to melt and solidify it.

In the method of the present invention as the coloring metal oxide, chromium oxide, iron oxide, vanadium oxide, and the like can be utilized.

In the method of the present invention, as a non-oxidizing gas atmosphere an inert gas, for example, argon, or nitrogen, or a gas wherein hydrogen is mixed in an amount of from 0.1 to 10 percent (in volume) to those gases can be used.

In the composition of the above-mentioned raw material mixture, it is preferable that in the principal components, the molar ratio of aluminum oxide to beryllium oxide is from 1:1 to 1:0.95 and also, it is preferable that the oxide of titanium (III) is mixed in a molar amount of from 0.1 to 2.0 percent to the principal components. Further, as the coloring metal oxide, the preferable amount to be mixed is from 0.2 to 2.0 mol percent in the case of chromium oxide, from 0.2 to 3.0 mol percent in the case of iron oxide, and from 0.2 to 2.0 mol percent in the case of vanadium oxide, to the principal components.

Although mixing of the above-mentioned components is preferably carried out by means of wet mixing, using ethyl alcohol and the like, it is not limited to the above as a matter of course. In order to mold the mixed raw material powder into a bar shape, for example, these mixed materials are packed into a rubber tube, and vacuum-degassed. Thereafter, the mixed material is pressed, for example, under a static hydraulic pressure of from 1 to 2 t/cm². The compressed shaped body taken out from the rubber tube is a bar-like body with a diameter of from 0.5 to 1.5 cm and a length of from 5 to 15 cm, for example.

In the method of the present invention, this compressed shaped bar is sintered by using, for example, an electric furnace in a non-oxidizing atmosphere, or is melted and solidified, for example, by means of a condense-heating floating zone method in the same atmosphere, to prepare a raw material bar.

In the case of using an inert gas such as argon, available on the market, or nitrogen, it is preferable to let heated iron pass through this atmosphere during the above-mentioned process in order to make the oxygen content as low as possible.

However, such a treatment is unnecessary when these gases are added with hydrogen in an amount from 0.1 to 10% (in volume). However, it is not preferable to increase the hydrogen content in the atmosphere, because this increases the evaporation of the beryllium oxide and chromium oxide from the raw material bar.

In the method of the present invention, when the compressed shaped bar is sintered to prepare a raw material bar, it is sintered by maintaining it at a temperature of from 1600° C. to 1800° C. for from 1 to 5 hours under a non-oxidizing gas atmosphere in, for example, an electric furnace wherein such an atmosphere can be regulated.

Further, in the case of melting and solidifying the shaped bar to prepare a raw material bar, a condense-heating floating zone method can be used, as will be described afterward.

In the method of the present invention, the raw material bar produced in the manner as described above is heated in a nonoxidizing gas atmosphere by a condense-heating type floating zone method, so that a chrysoberyl single crystal including trivalent titanium is grown.

The condense-heating type floating zone method used in the present invention will be explained by FIG. 1. The heating portion comprises a halogen lamp 5 and a rotating ellipsoidal mirror for condensing the light. A raw material bar 2 is arranged above the light condensing portion and a seed crystal 3 is arranged beneath that portion. When the output of the lamp is raised, the temperature of the light condensing portion rises, and the tips of the raw material bar 2 and the seed crystal 3 melt to form a molten zone 7. The raw material bar 2 and the seed crystal 3 are connected to an upper shaft 1 and a lower shaft 4 respectively. These are slowly lowered at a constant speed while simultaneously and mutually rotating in the opposite direction. Since the light condensing portion does not move, melting of the raw material bar 2 and cooling and crystallization of the seed crystal 3 occur simultaneously and a single crystal is grown. The raw material bar 2, generally, is composed of a high density sintered body with a similar composition to that of the seed crystal 3. Further, the crystal growing portion is isolated from the exterior by a quartz tube 8, and the growing atmosphere within the quartz tube 8 can be changed freely. When the compressed shaped bar is melted and solidified, using the condense-heating floating zone method to produce a raw material bar, the shaped bar is placed in the position taken by the raw material bar 2 and the melted and solidified raw material bar is placed in the position taken by the seed crystal 3 in the apparatus shown in FIG. 1. Then the output of the lamp is raised in a non-oxidizing atmosphere to form a heated melting zone, and the melting zone is moved at a rate of from 1 to 3 cm/hour to melt and solidify the shaped bar to provide a raw material bar.

In the stage of growing a chrysoberyl single crystal, the seed crystal is used by selecting a suitable portion from the chrysoberyl single crystal grown by the above-mentioned method. The c-axis direction is preferable for the growing direction of the single crystal. In this case, a columnar single crystal having no facet is grown.

It is not preferable to grow the single crystal in the a- or b-axis direction, because the yield worsens with a flat crystal wherein the c-plane is developed.

The growing rate of a chrysoberyl single crystal is preferably from 0.5 to 3.0 mm/hour, deposited matter being likely to appear in the crystal at at a rate higher than 3.0 mm/hour, and generally, growing at from 0.7 to 1.2 mm/hour is preferable.

In the case of using a mixed gas of argon and hydrogen as a growing atmosphere, a large quantity of hydrogen content causes a polycrystal or cracks due to instability of the single crystal growth, because the beryllium oxide and chromium oxide are easily evaporated. It is generally preferable to mix hydrogen in an amount of from about 0.1% to 3.0% (in volume) to argon.

Next, the grown chrysoberyl single crystal is heat-treated. In this heat-treating stage, solid-dissolved titanium is discharged from the chrysoberyl single crystal, then oxygen is diffused from the crystal surface to the interior so that trivalent titanium is oxidized to become quadrivalent, and the quadrivalent titanium is deposited in a needle shape as titanium dioxide.

In this stage of the heat-treatment, the chrysoberyl single crystal is heat-treated at a temperature of from 1200° C. to 1850° C. for one day or more. Thus needle crystals of titanium dioxide can be precipitated in the chrysoberyl single crystal.

Generally, it is preferable, in the heat-treating stage, that the chrysoberyl single crystal containing solid-dissolved trivalent titanium be heated in the air at a temperature of from 1200° C. to 1850° C., preferably from 1600° C. to 1850° C. for 1 day or more, and thereafter heated at from 1200° C. to 1600° C. for 1 day or more, whereby a chrysoberyl single crystal excellent in displaying a luminous band effect can be obtained.

EXAMPLE

As principal components, beryllium oxide with a purity of 99.9% and aluminum oxide with a purity of 99.9% were mixed with each other at a molar ratio of 1:0.99, the mixture was mixed with chromium oxide with a purity of 99.9% in a molar amount of 0.5% based on that of the principal components, titanium (III) oxide with a purity of 99.9% in an amount of 1.0% based on the molar amount of the principal components, and iron oxide with a purity of 99.9% in an amount of 0.5% based on the molar amount of the principal components, the resultant mixture was packed in a rubber tube and was pressed under a static hydraulic pressure of 1 t/cm$^2$ to provide a compressed shaped bar.

The compressed shaped bar was sintered at 1700° C. for 2 hours in a gas atmosphere consisting of argon mixed with 1% (in volume) of hydrogen to provide a raw material bar.

The resultant raw material bar was heated in a similar atmosphere to the above-mentioned sintering atmosphere by means of a condense-heating type floating zone apparatus, to grow a single crystal in a c-axis direction. The resultant single crystal was heat-treated at 1800° C. for 3 days then at 1400° C. for 3 days. A chrysoberyl single crystal excellent in displaying a luminous band effect was obtained.

We claim:

1. A method for producing a chrysoberyl single crystal displaying a luminous band effect, comprising the steps of:

(a) mixing a principal component consisting of nearly equimolar amounts of beryllium oxide and aluminum oxide with titanium (III) oxide and a coloring metallic oxide material consisting essentially of at least one member selected from the group consisting of iron oxide, chromium oxide and vanadium oxide, the amount of titanium oxide being 0.1 to 2.0 mole % of the amount of the principal component, and the amount of metallic oxide material being 0.2 to 3.0 mole % for iron oxide, 0.2 to 2.0 mole % for chromium oxide and 0.2 to 3.0 mole % for vanadium oxide based on the amount of the principal component;

(b) compression-shaping the resultant mixture in a mold to form a compressed bar-shaped body of the mixture;

(c) sintering the compressed bar-shaped body of the mixture in a non-oxidizing atmosphere to prepare a raw material bar;

(d) heating the raw material bar in a non-oxidizing atmosphere by means of a condense-heating type floating zone method at a temperature at which a chrysoberyl single crystal containing trivalent titanium solid-dissolved therein grows; and (e) heat-treating the chrysoberyl single crystal containing solid-dissolved trivalent titanium at a temperature of from 1200° C. to 1850° C. in air whereby the trivalent titanium is oxidized to quadrivalent titanium and resultant needle crystals of titanium (IV) oxide are precipitated and grow in one orientation in the chrysoberyl single crystal.

2. The method as claimed in claim 1, wherein the sintering procedure is carried out in an electric furnace at a temperature of from 1600° C. to 1800° C.

3. The method as claimed in claim 1, wherein the sintering procedure is carried out by means of a condense-heating floating zone method in which the compressed bar-shaped body of the mixture is melted and solidified.

4. The method as claimed in claim 1, wherein in the heating procedure, the chrysoberyl single crystal grows at a growing rate of from 0.5 to 3.0 mm/hr.

5. The method as claimed in claim 1, wherein the heat-treating procedure is carried out for at least one day.

6. The method as claimed in claim 5, wherein the heat-treating procedure is carried out at a temperature of from 1600° C. to 1850° C. for at least one day and then at a temperature of from 1200° C. to 1600° C. for at least one day.

* * * * *